(12) United States Patent
Shi

(10) Patent No.: US 10,553,145 B2
(45) Date of Patent: Feb. 4, 2020

(54) PIXEL STRUCTURE, DISPLAY PANEL AND DRIVING METHOD THEREOF

(71) Applicant: BOE TECHNOLOGY GROUP CO., LTD., Beijing (CN)

(72) Inventor: Shiming Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/579,911

(22) PCT Filed: Jun. 9, 2017

(86) PCT No.: PCT/CN2017/087722
§ 371 (c)(1),
(2) Date: Dec. 5, 2017

(87) PCT Pub. No.: WO2018/028292
PCT Pub. Date: Feb. 15, 2018

(65) Prior Publication Data
US 2018/0366052 A1    Dec. 20, 2018

(30) Foreign Application Priority Data
Aug. 12, 2016   (CN) .......................... 2016 1 0665854

(51) Int. Cl.
G09G 3/20     (2006.01)
(52) U.S. Cl.
CPC ......... *G09G 3/2074* (2013.01); *G09G 3/2003* (2013.01); *G09G 2300/0443* (2013.01); *G09G 2300/0452* (2013.01); *G09G 2310/027* (2013.01); *G09G 2310/0286* (2013.01)
(58) Field of Classification Search
CPC .............................. G09G 3/3275; H01L 27/32
See application file for complete search history.

(56) References Cited

U.S. PATENT DOCUMENTS 9,704,926 B2 * 7/2017 Kim .................... H01L 27/3218
10,297,214 B2 * 5/2019 Lin ....................... G09G 3/3614
(Continued)

FOREIGN PATENT DOCUMENTS

CN       101041648         9/2007
CN       101051648 A      10/2007
(Continued)

OTHER PUBLICATIONS

First Chinese Office Action, dated May 2, 2017, Chinese Application No. 201610665854.0.
(Continued)

*Primary Examiner* — Nelson M Rosario
(74) *Attorney, Agent, or Firm* — Womble Bond Dickinson (US) LLP

(57) ABSTRACT

Disclosed are a pixel structure, a display panel and a driving method thereof, the pixel structure comprising a plurality of alternately arranged first sub-pixel columns and second sub-pixel columns. The first sub-pixel columns comprise sub-pixels of two colors, the second sub-pixel columns are sub-pixel columns of single color, and the number of the first sub-pixel columns is one larger than that of the second sub-pixel columns. The first sub-pixel columns are one column more than the second sub-pixel columns, such that the whole pixel arrangement is a symmetrical arrangement.

Therefore, when in mirror display, an image signal processing algorithm consistent with that in normal display can still be maintained.

6 Claims, 4 Drawing Sheets

(56) References Cited

U.S. PATENT DOCUMENTS

| | | | |
|---|---|---|---|
| 2007/0064020 | A1 | 3/2007 | Credelle et al. |
| 2008/0001525 | A1* | 1/2008 | Chao .................. H01L 27/3218 313/500 |
| 2015/0029208 | A1 | 1/2015 | Kim |
| 2015/0348470 | A1 | 12/2015 | Wang et al. |
| 2016/0133675 | A1 | 5/2016 | Yata et al. |
| 2016/0198544 | A1 | 7/2016 | Chu |
| 2017/0263197 | A1 | 9/2017 | Zhu et al. |

FOREIGN PATENT DOCUMENTS

| | | |
|---|---|---|
| CN | 104050889 | 9/2014 |
| CN | 104347668 | 2/2015 |
| CN | 105118458 | 12/2015 |
| CN | 105826348 | 8/2016 |
| CN | 106298851 | 1/2017 |

OTHER PUBLICATIONS

International Search Report and Written Opinion with English Language Translation, dated Sep. 14, 2017, Application No. PCT/CN2017/087722.

Second Chinese Office Action, dated Aug. 24, 2017, Chinese Application No. 201610665854.0.

Third Chinese Office Action, dated Nov. 23, 2017, Chinese Application No. 201610665854.0

* cited by examiner

PIXEL STRUCTURE, DISPLAY PANEL AND DRIVING METHOD THEREOF

CROSS REFERENCE TO RELATED APPLICATION

The present application is the U.S. national phase entry of PCT/CN2017/087722, with an international filling date of Jun. 9, 2017, which claims the priority benefits of the patent application 201610665854.0 filed to the China Patent Office on Aug. 12, 2016, the disclosure of which is incorporated herein by virtue of reference.

TECHILD FIELD

The disclosure relates to the field of display technology, and in particular, to a pixel structure, a display panel and a driving method for the same.

BACKGROUND

Various display devices such as LCD displays, OLED displays have been widely applied, and brought great convenience and entertainment for people's work and livelihoods. Moreover, people also have higher and higher requirements for the image quality of the display devices, and the display effect of high quality has always been the pursuit of consumers and users. Therefore, it is desired that various display devices with high resolutions can be provided. In addition, there is still space for improvement in operation performance of current display devices.

SUMMARY

Embodiments of the disclosure provide an improved pixel structure, display panel and driving method for the same, for enhancing the performance of a display device.

An embodiment of the disclosure provides a pixel structure comprising a plurality of alternately arranged first sub-pixel columns and second sub-pixel columns, the first sub-pixel columns comprising sub-pixels of two colors, the second sub-pixel columns being sub-pixel columns of single color, and the number of the first sub-pixel columns being one larger than that of the second sub-pixel columns.

In a possible embodiment, two adjacent sub-pixels in each of the first sub-pixel columns and one sub-pixel in an adjacent said second sub-pixel column constitute one pixel.

In a possible embodiment, sub-pixels of two colors in the first sub-pixel columns comprise red sub-pixels and blue sub-pixels.

In a possible embodiment, the second sub-pixel columns are green sub-pixel columns.

In a possible embodiment, the size of the blue sub-pixels is larger than that of the red sub-pixels, and the size of the red sub-pixels is larger than that of the green sub-pixels.

A further embodiment of the disclosure provides a display panel comprising a pixel structure provided by any of the above-described embodiments of the disclosure, a plurality of data lines for inputting a data signal to respective sub-pixel columns in the pixel structure, and a source driver chip.

In a possible embodiment, the source driver chip comprises a row cache, a pixel algorithm processing unit, a data latch, a shift register, a digital-analog converter and an output cache. The row cache is used for receiving video data and outputting the video data to the pixel algorithm processing unit; the pixel algorithm processing unit is used for performing algorithm processing on the video data to obtain gray scale data corresponding to each pixel; the data latch is used for latching the gray scale data at the input terminal of the shift register; the shift register is used for shifting and outputting the gray scale data to the digital-analog converter under the control of a pixel clock; the digital-analog converter is used for converting the gray scale data into an analog signal and outputting it to the output cache; and the output cache is used for outputting the analog signal to the data lines.

In a possible embodiment, the display panel provided by the embodiment of the disclosure further comprises a plurality of gate lines and a gate driving circuit for inputting a scan signal to the gate lines.

A further embodiment of the disclosure provides a driving method for a display panel provided by the embodiment of the disclosure, the display panel comprising a plurality of alternately arranged first sub-pixel columns and second sub-pixel columns. The first sub-pixel columns comprise sub-pixels of two colors, the second sub-pixel columns are sub-pixel columns of a single color, and the number of the first sub-pixel columns is one larger than that of the second sub-pixel columns. The driving method comprises the following steps:

when in normal display, outputting the data signal by the source driver chip to the sub-pixel columns via the data lines following the order from the first column of sub-pixels to the last column of sub-pixels; and when in mirror display, outputting the data signal by the source driver chip to the sub-pixel columns via the data lines following the order from the last column of sub-pixels to the first column of sub-pixels.

In a possible embodiment, when in the normal display, the row cache of the source driver chip outputs the received video data to the pixel algorithm processing unit of the source driver chip following the order from the first column of sub-pixels to the last column of sub-pixels; the pixel algorithm processing unit performs the algorithm processing on the video data to obtain gray scale data corresponding to each pixel; the data latch of the source driver chip latches the gray scale data at the input terminal of the shift register in the source driver chip; and the shift register shifts and outputs the gray scale data to the digital-analog converter under control of the pixel clock following the order from the first column of sub-pixels to the last column of sub-pixels. When in the mirror display, the row cache outputs the received video data to the pixel algorithm processing unit following the order from the last column of sub-pixels to the first column of sub-pixels; the pixel algorithm processing unit performs the algorithm processing on the video data to obtain gray scale data corresponding to each pixel; the data latch latches the gray scale data at the input terminal of the shift register; and the shift register shifts and outputs the gray scale data to the digital-analog converter under control of the pixel clock following the order from the last column of sub-pixels to the first column of sub-pixels.

In a possible embodiment, the digital-analog converter and the output cache in the source driver chip are controlled by an output control signal. When a rising edge of the output control signal arrives, the digital-analog converter of the source driver chip converts the gray scale data into an analog signal and outputs it to the output cache of the source driver chip; and when a falling edge of the output control signal arrives, the output cache outputs the analog signal to the data lines.

In a possible embodiment, the driving method provided by the embodiment of the disclosure further comprises inputting the scan signal by the gate driving circuit to the gate lines row by row when in the normal display and in the mirror display.

DETAILED DESCRIPTION OF EMBODIMENTS

In the following, implementations of a pixel structure, a display panel and a driving method thereof provided by embodiments of the disclosure will be described in detail in conjunction with the drawings.

Figure 1:
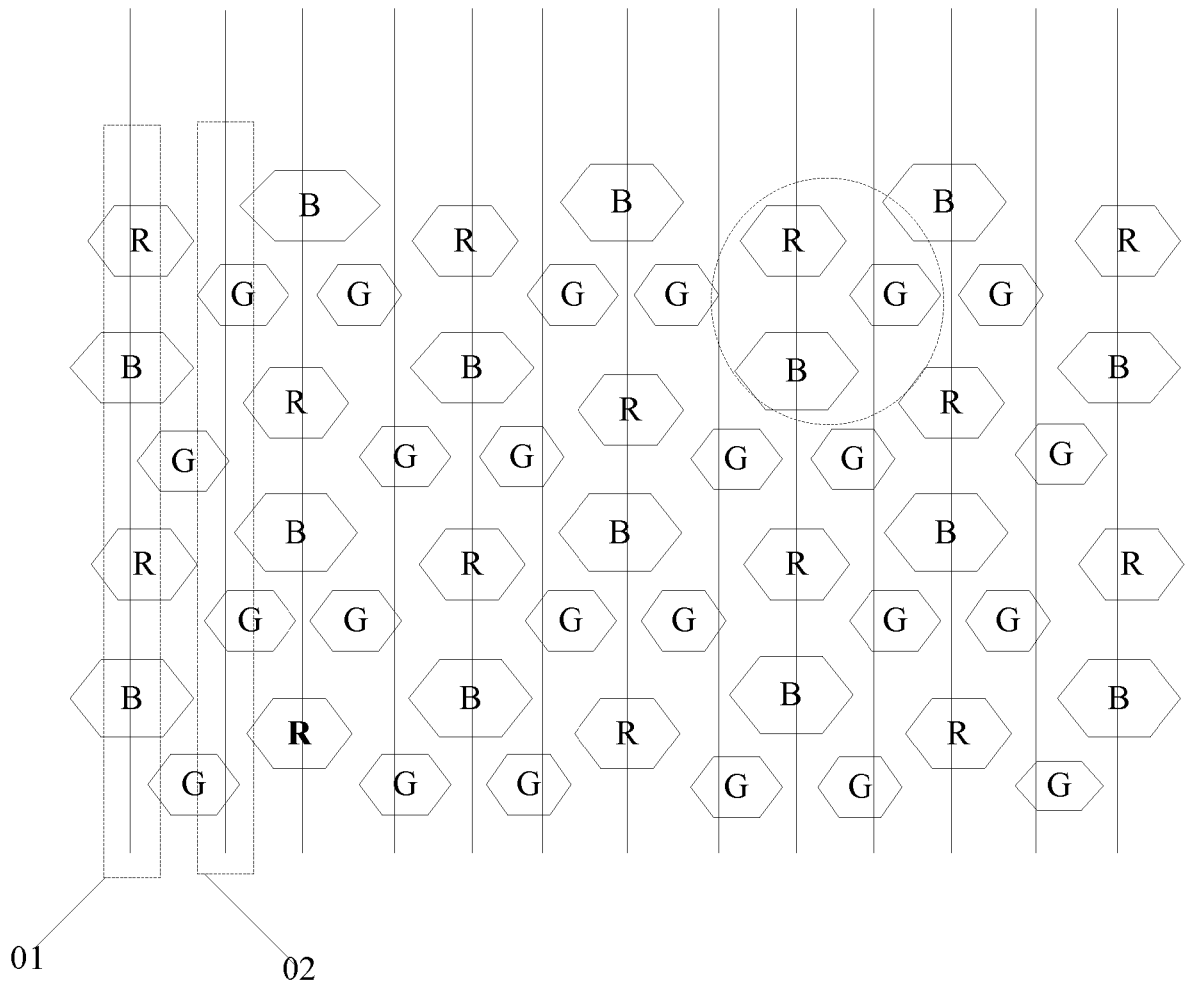
FIG. 1 is a schematic diagram of a pixel structure provided by an embodiment of the disclosure.

An embodiment of the disclosure provides a pixel structure, as shown in FIG. 1, comprising a plurality of alternately arranged first sub-pixel columns 01 and second sub-pixel columns 02. The first sub-pixel columns 01 comprising sub-pixels of two colors, the second sub-pixel columns 02 being sub-pixel columns of a single color, and the number of the first sub-pixel columns 01 being one larger than that of the second sub-pixel columns 02.

Figure 2:
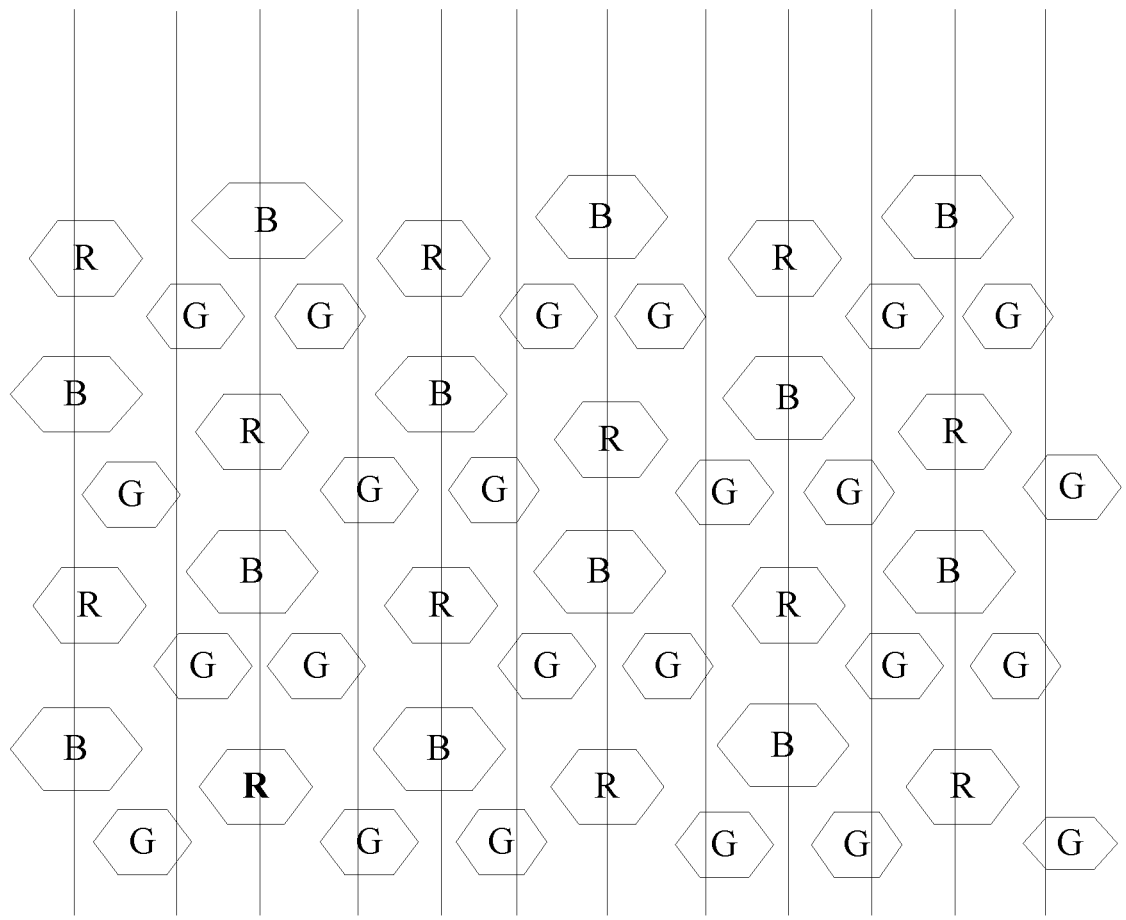
FIG. 2 is a schematic diagram of an ordinary pixel structure.

In the pixel structure provided by the embodiment of the disclosure, the first sub-pixel columns are one column more than the second sub-pixel columns, so the whole pixel structure is a symmetrical arrangement. In case of mirror display, an image signal processing algorithm consistent with the case of normal display can be maintained, which may thereby increase the flexibility in the operation the driver chip. In general, for example, as shown in FIG. 2, a pixel structure may be in the form of a pixel arrangement of GGRB, the sub-pixel arrangement order of each row is RG-BG-RG-BG or BG-RG-BG-RG, and thus the last one sub-pixel of each row is G, which thus easily results in that the last column of G pixels is relatively sharp. Moreover, since the whole pixel arrangement is asymmetrical, the processing algorithm in the source driver chip needs rearrangement of a special channel when performing mirror display. For example, when assigning values for pixels from left to right changes into one from right to left, if originally the first column of sub-pixels are R sub-pixels or B sub-pixels, at this point, they are replaced with G sub-pixels. As such, it will cause that when the source driver chip processes mirror display data, the algorithm is abnormal due to the asymmetrical arrangement of pixels. For the pixel structure proposed by the embodiment of the disclosure, when in the normal display, the order in assigning values for sub-pixels may for example be from left to right (namely, from the first column of sub-pixels to the last column of sub-pixels), and when in the mirror display, the order in assigning values for sub-pixels may for example be from right to left (namely, from the last column of sub-pixels to the first column of sub-pixels). Since the number of the first sub-pixel columns 01 is one larger than that of the second sub-pixel columns 02, which causes the whole pixel structure to be a symmetrical structure, the same image signal processing algorithm can be used for both the normal display and the mirror display. Thus, it can be avoided for the display panel that the image signal processing algorithm is abnormal due to an asymmetrical pixel structure when in the mirror display, and at the same time the problem that the single color (e.g., the color of the G sub-pixels) at an edge of the display panel is relatively sharp can be mitigated or overcome. Therefore, applying such a pixel structure in a display device may enhance the operating performance of the display device during the mirror display, and is conducive to improving the image display quality.

In an example, for the pixel structure provided by the embodiment of the disclosure, as shown in FIG. 1, sub-pixels of two colors comprised by the first sub-pixel columns 01 are red sub-pixels R and blue sub-pixels B, respectively, and the second sub-pixel columns 02 are green (G) sub-pixel columns. In particular, embodiments of the disclosure may employ a SPR (sub-pixel rendering) method, thereby achieving high resolution product, that is, two or even one sub-pixel is used to replace the original three sub-pixels R, G, and B, thereby reducing the difficulty in design and manufacturing process. Meanwhile, a certain algorithm may be employed to implement sharing between adjacent sub-pixels. For example, two adjacent sub-pixels in each of the first sub-pixel columns and one sub-pixel in an adjacent second sub-pixel column may constitute one pixel, which eventually realizes a high resolution display product.

For example, for the pixel structure provided by the embodiment of the disclosure, as shown in FIG. 1, red and blue sub-pixels in a first sub-pixel column and a green sub-pixel in an adjacent second sub-pixel column may constitute one pixel of three primary colors, and thus normal image display may be implemented by means of a specific assignment algorithm. In addition, in the pixel structure provided by the embodiment of the disclosure, the whole pixel arrangement structure is a symmetrical structure, which may thus avoid the problem of the display panel that the image signal processing algorithm is abnormal due to an asymmetrical pixel arrangement when in the mirror display, and at the same time may overcome the problem that the green color at an edge of the display panel is relatively sharp.

In practical implementation, in the pixel structure provided by the embodiment of the disclosure, the size of the blue sub-pixels may be set to be larger than that of the red sub-pixels, and the size of the red sub-pixels may be set to be larger than that of the green sub-pixels. Generally, the luminous efficiency of a blue sub-pixel is relatively low, while the luminous efficiency of a red sub-pixel is higher than that of the blue sub-pixel and lower than that of a green sub-pixel. Therefore, by enabling the size of the blue sub-pixels to be larger than that of the red sub-pixels, and the size of the red sub-pixels to be larger than that of the green sub-pixels, the luminous efficiencies of the sub-pixels of respective colors may be balanced, and the quality of the whole display panel may be enhanced.

Figure 3:
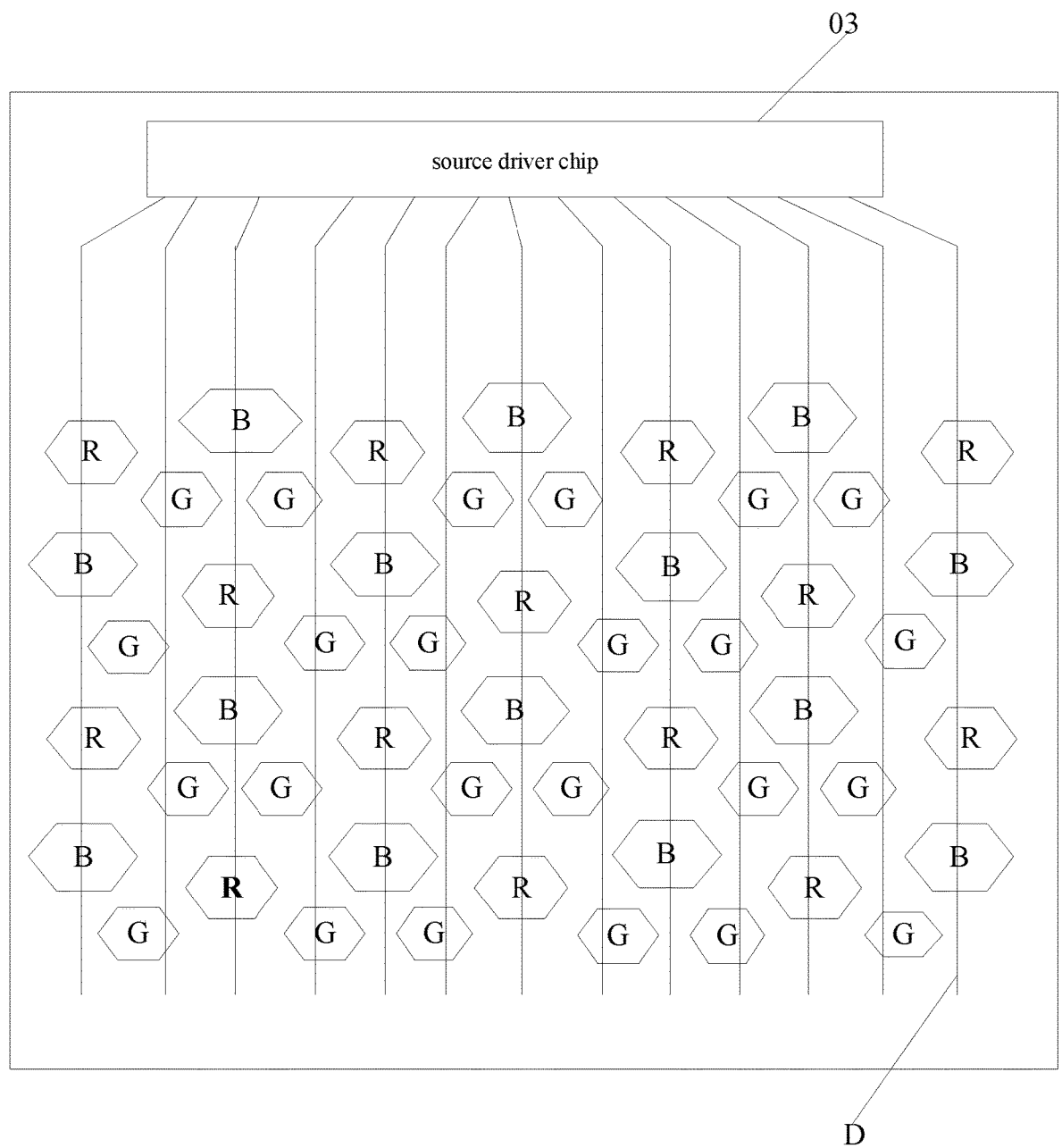
FIG. 3 is a structural diagram of a display panel provided by an embodiment of the disclosure.

Based on the same inventive concept, another embodiment of the disclosure provides a display panel. As shown in FIG. 3, the display panel comprises a pixel structure provided by the above embodiment of the disclosure, a plurality of data lines D for inputting a data signal to individual sub-pixel columns in the pixel structure, and a source driver chip 03. In particular, when the display panel is performing image display, the source driver chip performs image information processing for the image data, and then assigns a corresponding signal to corresponding sub-pixels in the pixel structure via the data lines, thereby implementing normal image display. The display panel may be applied in any product or component with the display function, such as a mobile phone, a tablet computer, a television, a display, a notebook computer, a digital photo frame, a navigator, etc. Since the principle of solving the problems is similar to that of the pixel structure described in the above embodiments, the implementation of the display panel may refer to that of the above-described pixel structure, and what is identical will not be repeated any more.

Figure 4:
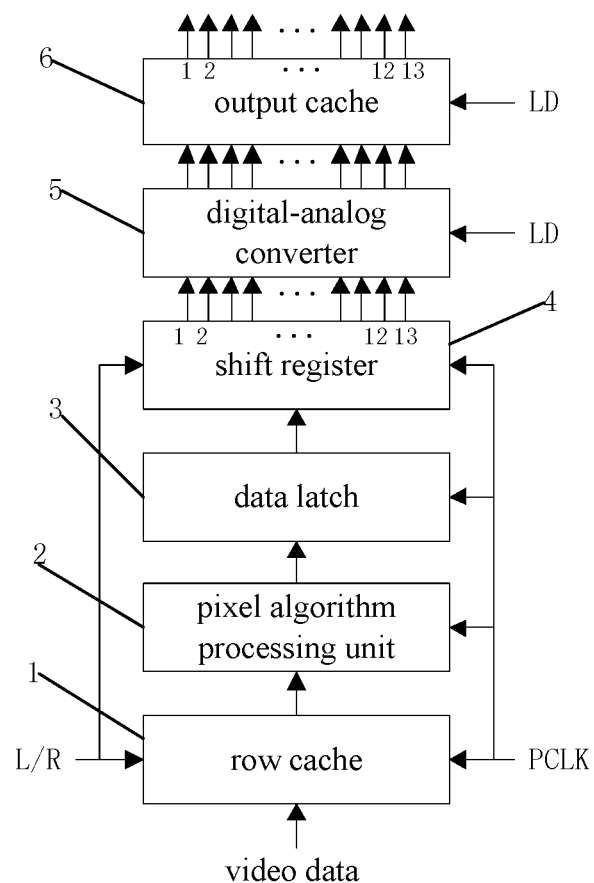
FIG. 4 is a structural diagram of a source driver chip provided by an embodiment of the disclosure.

In an example, in the display panel provided by the embodiment of the disclosure, as shown in FIG. 4, the source driver chip 03 may comprise a row cache 1, a pixel algorithm processing unit 2, a data latch 3, a shift register 4, a digital-analog converter 5 and an output cache 6. The row cache 1 is used for receiving video data and outputting the video data to the pixel algorithm processing unit 2; the pixel algorithm processing unit 2 is used for performing algorithm processing on the video data to obtain gray scale data for each pixel; the data latch 3 is used for latching the gray scale data at the input terminal of the shift register 4; the shift register 4 is used for shifting and outputting the gray scale data to the digital-analog converter 5 under the control of a pixel clock signal PCLK; the digital-analog converter 5 is used for converting the gray scale data into an analog signal and outputting it to the output cache 6; and the output cache 6 is used for outputting the analog signal to the data lines. That is to say, units such as the row cache, the pixel algorithm processing unit, the data latch, the shift register, the digital-analog converter, and the output cache, etc. comprised by the source driver chip may be used for receiving and processing video data as well as outputting a corresponding data signal, respectively, eventually realizing that the source driver chip provides a corresponding data signal to corresponding data lines, lighting corresponding sub-pixels, and achieving the normal display of the display panel. In practice, the display panel provided by the embodiment of the disclosure may further comprise a plurality of gate lines (not shown in the figure), and a gate driving circuit (not shown in the figure) for inputting a scan signal to the individual gate lines. In particular, the gate driving circuit in the display panel implements a row-by-row scanning for the display panel by inputting the scan signal to the individual gate lines row by row, thereby coordinating with the frame-by-frame refresh of the source driver chip to implement the normal display of the display panel.

Based on the same inventive concept, a further embodiment of the disclosure provides a driving method for a display panel. The display panel comprises a plurality of alternately arranged first sub-pixel columns and second sub-pixel columns, the first sub-pixel columns comprising sub-pixels of two colors, the second sub-pixel columns being sub-pixel columns of a single color, and the number of the first sub-pixel columns being one larger than that of the second sub-pixel columns. The driving method may comprise the following steps:

when in normal display, outputting the data signal by the source driver chip to the sub-pixel columns via the data lines following the order from the first column of sub-pixels to the last column of sub-pixels; and when in mirror display, outputting the data signal by the source driver chip to the sub-pixel columns via the data lines following the order from the last column of sub-pixels to the first column of sub-pixels.

For the driving method provided by the embodiment of the disclosure, since the pixel structure is a symmetrical structure, when in the mirror display, it can still maintain an image processing algorithm consistent with the normal display, which may thus increase the flexibility of the function of the driver chip. In particular, for the two ways of assigning values for sub-pixel, i.e., from the first column of sub-pixels to the last column of sub-pixels and from the last column of sub-pixels to the first column of sub-pixels, since the pixel arrangement is symmetrical, the same image signal processing algorithm may be adopted, and thereby the problem of the display panel may be avoided that the image signal processing algorithm is abnormal due to an asymmetrical arrangement of pixels when in the mirror display.

According to an example of the disclosure, in the driving method provided by the embodiment of the disclosure, the row cache of the source driver chip may select to follow the order from the first column of sub-pixels to the last column of sub-pixels or the order from the last column of sub-pixels to the first column of sub-pixels according to the level (a high level or a low level) of a control signal L/R (as shown in FIG. 4), to output the received video data to the pixel algorithm processing unit of the source driver chip. The shift register may shift and output the gray scale data to the digital-analog converter according to the level (a high level or a low level) of the control signal L/R (as shown in FIG. 4) following the order from the first column of sub-pixels to the last column of sub-pixels or the order from the last column of sub-pixels to the first column of sub-pixels; and then an analog signal corresponding to the image data is generated by the digital-analog converter, and outputted to corresponding data lines via the output cache, thereby achieving the normal display or the mirror display for the display panel.

In an embodiment, when in the normal display, the control signal L/R is of a high level, and the row cache outputs the received video data to the pixel algorithm processing unit following the order from the first column of sub-pixels to the last column of sub-pixels. The pixel algorithm processing unit may in turn perform algorithm processing on the video data to obtain gray scale data corresponding to each pixel. The data latch of the source driver chip then latches the gray scale data at the input terminal of the shift register in the source driver chip. The shift register shifts and outputs the gray scale data to the digital-analog converter under the control of the pixel clock signal PCLK following the order from the first column of sub-pixels to the last column of sub-pixels. Then an analog signal corresponding to the image data is provided by the digital-analog converter, and outputted to corresponding data lines via the output cache, thereby realizing the normal display of the display panel;

In case of the mirror display, the control signal L/R is a low level signal, and the row cache outputs the received video data to the pixel algorithm processing unit following the order from the last column of sub-pixels to the first column of sub-pixels. The pixel algorithm processing unit performs algorithm processing on the video data to obtain gray scale data corresponding to each pixel. The data latch latches the gray scale data at the input terminal of the shift register. The shift register shifts and outputs the gray scale data to the digital-analog converter under the control of the pixel clock signal PCLK following the order from the last column of sub-pixels to the first column of sub-pixels. Then an analog signal corresponding to the image data is provided by the digital-analog converter, and outputted to corresponding data lines via the output cache, thereby achieving the mirror display for the display panel. Since the pixel structure in the display panel of the embodiment is symmetrical, the algorithm for the normal display and the mirror display in the source driver chip is consistent, which thus avoids the problem for the display panel that the image signal processing algorithm is abnormal during the mirror display due to an asymmetrical arrangement of pixels.

According to an embodiment of the disclosure, the digital-analog converter and the output cache may be controlled by one and the same output control signal LD (as shown in FIG. 4). When a rising edge of the output control signal LD arrives, the digital-analog conversion is performed, and when a falling edge arrives, the analog signal is outputted. In particular, when a rising edge of the output control signal LD arrives, the digital-analog converter of the source driver chip may convert the gray scale data into an analog signal and output it to the output cache of the source driver chip, and when a falling edge of the output control signal LD arrives, the output cache outputs the analog signal to the data lines. The row cache, pixel algorithm processing unit, data latch, and shift register may accomplish respective functions under the control of the pixel clock signal PCLK, to achieve the normal display of the display panel.

According to a further embodiment of the disclosure, the driving method may further comprise inputting the scan signal to the gate lines row by row by the gate driving circuit during the normal display and the mirror display. In particular, during the normal display and the mirror display, the gate driving circuit inputs the scan signal to individual gate lines, thereby coordinating with the frame-by-frame refresh of the source driver chip to realize dynamic picture display of the display panel.

The embodiments of the disclosure provide a pixel structure, a display panel and a driving method for the same. The pixel structure comprises a plurality of alternately arranged first sub-pixel columns and second sub-pixel columns. The first sub-pixel columns comprise sub-pixels of two colors, the second sub-pixel columns are sub-pixel columns of a single color, and the number of the first sub-pixel columns is one larger than that of the second sub-pixel columns. Since the first sub-pixel columns are one column more than the second sub-pixel columns, the whole pixel arrangement is a symmetrical arrangement. When in the mirror display, an image signal processing algorithm consistent with the normal display can still be maintained, which may increase flexibility in the operation of the driver chip. As such, the fluency of the display device operating in the mirror display mode may be improved, and the performance of the display device may be enhanced.

Clearly, various modifications and variations may be made to the disclosure by the skilled in the art without departing from the spirit and scope of the invention. As such, the invention is also intended to include these modifications and variations, if the modifications and variations of the disclosure pertain to the scope of the claims and equivalences thereof.

The invention claimed is:

1. A display panel, comprising a pixel structure, a plurality of data lines for inputting a data signal to respective sub-pixel columns in the pixel structure, and a source driver chip, wherein the pixel structure comprises a plurality of alternately arranged first sub-pixel columns and second sub-pixel columns, wherein the first sub-pixel columns comprise sub-pixels of two colors, the second sub-pixel columns are sub-pixel columns of single color, and the number of the first sub-pixel columns is one larger than that of the second sub-pixel columns, wherein the source driver chip comprises a row cache, a pixel algorithm processing unit, a data latch, a shift register, a digital-analog converter and an output cache, wherein the row cache is used for receiving video data and outputting the video data to the pixel algorithm processing unit, the pixel algorithm processing unit is used for performing algorithm processing on the video data to obtain gray scale data corresponding to each pixel, the data latch is used for latching the gray scale data at an input terminal of the shift register, the shift register is used for shifting and outputting the gray scale data to the digital-analog converter under control of a pixel clock signal, the digital-analog converter is used for converting the gray scale data into an analog signal and outputting it to the output cache, and the output cache is used for outputting the analog signal to the data lines.

2. The display panel as claimed in claim 1, wherein two adjacent sub-pixels in each of the first sub-pixel columns and one sub-pixel in an adjacent second sub-pixel column constitute one pixel.

3. The display panel as claimed in claim 2, wherein the sub-pixels of two colors in the first sub-pixel columns comprise red sub-pixels and blue sub-pixels.

4. The display panel as claimed in claim 3, wherein the second sub-pixel columns are green sub-pixel columns.

5. The display panel as claimed in claim 4, wherein a size of each of the blue sub-pixels is larger than that of each of the red sub-pixels, and the size of each of the red sub-pixels is larger than that of each of the green sub-pixels.

6. The display panel as claimed in claim 1, further comprising a plurality of gate lines and a gate driving circuit for inputting a scan signal to the gate lines.

* * * * *